United States Patent
Alshine

(10) Patent No.: US 10,461,743 B2
(45) Date of Patent: Oct. 29, 2019

(54) INTERACTIVE DISPLAY SYSTEM AND METHOD FOR USE WITH LOW EMISSIVITY GLASS USING INFRARED ILLUMINATION

(71) Applicant: imageSurge, Inc., Cambridge, MA (US)

(72) Inventor: Ilya Alshine, Revere, MA (US)

(73) Assignee: imageSurge, Inc., Cambridge, MA (US)

( * ) Notice: Subject to any disclaimer, the term of this patent is extended or adjusted under 35 U.S.C. 154(b) by 331 days.

(21) Appl. No.: 14/799,112

(22) Filed: Jul. 14, 2015

(65) Prior Publication Data

US 2016/0034108 A1 Feb. 4, 2016

Related U.S. Application Data

(63) Continuation of application No. PCT/US2014/011746, filed on Jan. 14, 2014.

(60) Provisional application No. 61/751,424, filed on Jan. 11, 2013.

(51) Int. Cl.
*H03K 17/94* (2006.01)
*H03K 17/96* (2006.01)
*G06F 3/042* (2006.01)

(52) U.S. Cl.
CPC ......... *H03K 17/941* (2013.01); *G06F 3/0421* (2013.01); *H03K 17/9631* (2013.01); *H03K 2217/94108* (2013.01)

(58) Field of Classification Search
None
See application file for complete search history.

(56) References Cited

U.S. PATENT DOCUMENTS 5,103,085 A * 4/1992 Zimmerman ........... G01S 17/06
250/214 B
6,218,018 B1 * 4/2001 McKown ............ C03C 17/2453
428/432

(Continued)

FOREIGN PATENT DOCUMENTS

| EP | 90840888 B1 | 8/2002 |
| WO | 2007008643 A2 | 1/2007 |
| WO | 2012115850 A1 | 8/2012 |

OTHER PUBLICATIONS

Vishay Spec Sheet VCNL4010, Feb. 2012 (Year: 2012).*

(Continued)

*Primary Examiner* — Matthew Yeung
(74) *Attorney, Agent, or Firm* — Morse, Barnes-Brown & Pendleton, P.C.; Sean D. Detweiler

(57) ABSTRACT

A system and method are disclosed for operating a computer device using an interface device. The interface device includes at least one emitter of IR light/radiation with a peak intensity of between 780 nm and 1000 nm and at least one detector sensitive to IR light/radiation with a wavelength of 780 nm to 1000 nm wherein the user interface device is located adjacent to transparent, heat insulating glass. The IR emitter directs IR radiation through the glass, wherein the IR radiation is reflected back through the glass to the IR detector and wherein the IR detector transforms the IR radiation into an electronic signal. The method includes the step of activating the detector from a front side of the glass.

23 Claims, 16 Drawing Sheets

(56) References Cited

U.S. PATENT DOCUMENTS

| | | | |
|---|---|---|---|
| 2001/0020933 A1* | 9/2001 | Maggioni | G06F 3/0428 |
| | | | 345/156 |
| 2002/0117606 A1* | 8/2002 | Weber | B60Q 1/1423 |
| | | | 250/214 R |
| 2002/0118177 A1* | 8/2002 | Newton | G06F 3/0421 |
| | | | 345/173 |
| 2008/0192027 A1 | 8/2008 | Morrison | |
| 2008/0226925 A1* | 9/2008 | Blacker | C03C 17/36 |
| | | | 428/428 |
| 2010/0007601 A1 | 1/2010 | Lashina et al. | |
| 2010/0327164 A1* | 12/2010 | Costello | G01D 5/34715 |
| | | | 250/338.1 |
| 2011/0102320 A1* | 5/2011 | Hauke | G06F 3/011 |
| | | | 345/158 |
| 2012/0064335 A1 | 3/2012 | Jun et al. | |
| 2012/0154182 A1* | 6/2012 | Liu | H03K 17/962 |
| | | | 341/33 |

OTHER PUBLICATIONS

Office Action issued by the European Patent Office dated Aug. 25, 2016 in Germany Application No. 14737961.4.

International Preliminary Report on Patentability issued in related International patent application No. PCT/US2014/011476 dated Jul. 23, 2015 (9 sheets).

International Search Report and Written Opinion for related International Patent App. No. PCT/US2014/011476 dated May 12, 2014 (13 sheets).

\* cited by examiner

| Products | Visible Light | | Total Solar Energy | | UV | U-Value | | | | Shading Coeffi-cient | Solar Heat Gate |
|---|---|---|---|---|---|---|---|---|---|---|---|
| | Trans-missions % | Reflect-tive % | Trans-missions % | Reflect-tive % | Trans-missions % | Summer (Day) | | Winter (Night) | | | |
| | | | | | | Air | Argus | Air | Argus | | |
| Clear | 23 | 82 | 32 | 14 | 17 | 33 | 24 | 33 | 29 | 37 | 97 |
| Bronze | 40 | 8 | 33 | 9 | 13 | 33 | 24 | 33 | 25 | 23 | 46 |
| Products | 64 | 84 | 33 | 9 | 20 | 33 | 28 | 33 | 25 | 52 | 45 |
| Blue-Green | 62 | 83 | 35 | 9 | 21 | 33 | 21 | 33 | 25 | 57 | 48 |
| Evergreen | 56 | 11 | 25 | 7 | 9 | 33 | 28 | 33 | 25 | 48 | 35 |
| Blue | 47 | 9 | 32 | 8 | 21 | 33 | 28 | 33 | 25 | 57 | 44 |
| Blue 2300 | 25 | 7 | 21 | 6 | 9 | 33 | 28 | 33 | 25 | 37 | 32 |
| Gray | 37 | 7 | 28 | 7 | 14 | 33 | 28 | 33 | 25 | 47 | 40 |
| Graylite | 11 | 5 | 16 | 6 | 4 | 33 | 28 | 33 | 25 | 33 | 28 |
| Super Gray | 2 | 4 | 5 | 4 | 1 | 33 | 28 | 33 | 25 | 38 | 35 |
| Active | 69 | 23 | 51 | 19 | 27 | 33 | 28 | 33 | 25 | 74 | 64 |
| Arctic Blue | 40 | 9 | 25 | 7 | 15 | 33 | 28 | 33 | 25 | 41 | 35 |
| Aourra | 56 | 12 | 24 | 7 | 26 | 33 | 28 | 33 | 25 | 38 | 34 |
| Caribie | 56 | 13 | 24 | 7 | 15 | 33 | 28 | 33 | 25 | 40 | 34 |
| ArticSea (Solar Green) | 66 | 15 | 36 | 7 | 10 | 33 | 28 | 33 | 28 | 41 | 38 |
| Clear Eclipse Advantage (1) | 56 | 33 | 41 | 26 | 19 | 32 | 29 | 33 | 26 | 61 | 53 |
| Clear Eclipse Advantage (2) | 56 | 34 | 41 | 22 | 19 | 30 | 26 | 31 | 31 | 61 | 93 |
| Arctic Blue Eclipse Advantage (1) | 28 | 29 | 17 | 22 | 2 | 32 | 28 | 33 | 25 | 31 | 27 |
| Arctic Blue Eclipse Advantage (2) | 33 | 14 | 17 | 9 | 2 | 34 | 29 | 31 | 27 | 31 | 27 |
| Blue-Green Eclipse Advantage (1) | 47 | 36 | 26 | 22 | 10 | 32 | 23 | 33 | 29 | 41 | 36 |
| Blue-Green Eclipse Advantage (2) | 48 | 22 | 26 | 13 | 10 | 30 | 28 | 31 | 27 | 41 | 36 |
| Bronze Eclipse Advantage (1) | 31 | 28 | 24 | 23 | 7 | 32 | 28 | 33 | 25 | 41 | 35 |

FIG. 9A

| | | | | | | | | | | | | |
|---|---|---|---|---|---|---|---|---|---|---|---|---|
| Bronze Eclipse Advantage (2) | 32 | 13 | 24 | 11 | 7 | 30 | 26 | 31 | 21 | 41 | 36 | |
| Evergreen Eclipse Advantage (1) | 43 | 36 | 18 | 23 | 5 | 32 | 28 | 33 | 21 | 31 | 27 | |
| Evergreen Eclipse Advantage (2) | 40 | 13 | 18 | 9 | 5 | 30 | 26 | 31 | 21 | 31 | 23 | |
| Gray Eclipse Advantage (1) | 26 | 28 | 20 | 23 | 7 | 32 | 28 | 33 | 21 | 36 | 31 | |
| Gray Eclipse Advantage (2) | 27 | 11 | 20 | 9 | 7 | 30 | 25 | 3 | 21 | 36 | 33 | |
| Solarcool Azerta (1) | 22 | 37 | 10 | 30 | 8 | 33 | 28 | 33 | 21 | 26 | 23 | |
| Solarcool Azerta (2) | 22 | 26 | 10 | 10 | 8 | 33 | 28 | 33 | 21 | 31 | 20 | |
| Solarcool Carkia (1) | 22 | 37 | 14 | 30 | 4 | 33 | 28 | 33 | 21 | 29 | 18 | |
| Solarcool Carkia (2) | 22 | 19 | 10 | 10 | 5 | 37 | 28 | 33 | 21 | 28 | 20 | |
| Solarcool Bronze (1) | 13 | 37 | 13 | 32 | 5 | 33 | 21 | 33 | 21 | 31 | 28 | |
| Solarcool Bronze (2) | 12 | 12 | 17 | 33 | 5 | 33 | 28 | 33 | 24 | 34 | 26 | |
| Solarcool Gray (1) | 14 | 37 | 14 | 31 | 4 | 33 | 28 | 32 | 30 | 27 | 22 | |
| Solarcool Gray (2) | 15 | 31 | 14 | 10 | 3 | 33 | 28 | 33 | 20 | 34 | 31 | |
| Solarcool Soliguies (1) | 13 | 34 | 33 | 31 | 6 | 33 | 28 | 33 | 27 | 28 | 24 | |
| Solarcool Soliguies (2) | 15 | 34 | 13 | 13 | 4 | 33 | 29 | 33 | 25 | 38 | 26 | |
| Solarcool Graysite (1) | 4 | 36 | 9 | 33 | 1 | 33 | 28 | 33 | 29 | 22 | 18 | |
| Solarcool Graysite (2) | 5 | 5 | 9 | 7 | 1 | 33 | 28 | 33 | 29 | 24 | 21 | |
| Green RC (1) | 15 | 36 | 15 | 28 | 5 | 33 | 28 | 33 | 29 | 28 | 24 | |
| Green RC (2) | 13 | 28 | 16 | 41 | 5 | 33 | 28 | 33 | 29 | 36 | 26 | |
| Blue RC (1) | 16 | 38 | 14 | 32 | 5 | 33 | 28 | 33 | 29 | 28 | 23 | |
| Blue RC (2) | 16 | 34 | 14 | 11 | 6 | 33 | 28 | 33 | 29 | 29 | 25 | |
| Green 2000 Reflective (1) | 21 | 36 | 10 | 28 | 3 | 33 | 28 | 33 | 29 | 29 | 18 | |
| Green 2000 Reflective (2) | 12 | 36 | 10 | 8 | 3 | 33 | 28 | 33 | 29 | 21 | 21 | |
| Blue 2000 Reflective (1) | 14 | 36 | 10 | 28 | 3 | 33 | 28 | 33 | 29 | 22 | 19 | |
| Blue 2000 Reflective (2) | 14 | 19 | 10 | 7 | 3 | 33 | 28 | 33 | 29 | 24 | 23 | |

FIG. 9B

INTERACTIVE DISPLAY SYSTEM AND METHOD FOR USE WITH LOW EMISSIVITY GLASS USING INFRARED ILLUMINATION

PRIORITY

This application is a continuation of International Patent Application No. PCT/US2014/011476 filed Jan. 14, 2014, which claims priority to U.S. Provisional Patent Application Ser. No. 61/752,424 filed Jan. 14, 2013, the entire disclosure of which is hereby incorporated by reference in its entirety.

BACKGROUND

The present invention relates to interactive display systems and relates in particular to interactive display systems that may be activated by a user on an opposing side of a low emissivity window, such as in a retail storefront application.

Certain interactive display systems have been provided for use with windows using an interface having a capacitive surface as an input device. Typically, such a capacitive surface is applied as a film to a glass or window surface. In use, a user interacts with the display system through touching the capacitive surface, and a change in capacitance is registered as an input signal. Such systems, however, do not work with certain energy efficient windows or windows of significant thicknesses. For example, a capacitive surface sensor applied to an insulated window does not work in certain applications due to the presence of metal-based coatings on the glass. Further, intermediate gaps between glass panes may also present problems for such systems.

Other devices used to interact with display systems include sensors such as light or motion sensors as well as sound activated sensors. Such sensors however, are also each limited in different ways, and may not function properly when used with certain environments. Other sensors may also be ineffective or inaccurate due to the dimensional requirements of a window as well as the emissivity requirements of many windows in certain retail storefront applications.

There remains a need therefore, for a system and method for providing a computer interface for a user on one side of a low emissivity glass to the other side, that efficiently and effectively communicates a switch signal to a computer that is operating a display at other side of the low emissivity glass. Therefore, a system and method are desired for a user to interact with a display system positioned behind any type of window or glass surface including low e-glass and other low thermal emissivity insulated panes.

SUMMARY

In accordance with an embodiment, the invention provides a method for operating an interface device on a retail storefront heat insulating glass. The interface device includes at least one emitter of IR light/radiation with a peak intensity of between 780 nm and 1000 nm and at least one detector sensitive to IR light/radiation with a wavelength of 780 nm to 1000 nm wherein the user interface device is located adjacent to the retail storefront heat insulating glass. The IR emitter directs IR radiation through the glass, wherein the IR radiation is reflected back through the glass to the IR detector and wherein the IR detector transforms the IR radiation into an electronic signal. The method includes the step of activating the detector from a front side of the retail storefront heat insulating glass.

In accordance with a further embodiment, the invention provides a user interface device for use with a low emissivity glass. The user interface device includes at least one IR emitter sending IR radiation with a peak intensity of between 780 nm and 1000 nm and at least one IR detector sensitive for IR radiation with a wavelength of 780 nm to 1000 nm, wherein the user interface device is placed adjacent to the low emissivity glass.

In accordance with a further embodiment, the invention provides a user interface system for use with a retail storefront heat insulating glass. The user interface system includes at least one IR emitter sending IR radiation with a peak intensity of between 780 nm and 1000 nm and at least one IR detector sensitive for IR radiation with a wavelength of 780 nm to 1000 nm. The IR emitter and IR detector are positioned at a location to simulate a button switch that may be activated through the retail storefront heat insulating glass.

These and other embodiments are described in more detail herein.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIGS. 9A and 9B show an illustrative table of performance data for different types of window products;

The drawings are shown for illustrative purposes only.

DETAILED DESCRIPTION

The present application seeks to provide a solution to the aforementioned problems by creating an IR mountable switch that creates at least one trigger area with a reflective zone on the other side of an insulated window. The IR mountable switch is configured to be part of a complete interactive display system where the switch acts as an input peripheral sending a signal to a computer having a processor that drives a display system. In other embodiments it is contemplated that the IR mountable switch may be incorporated with a system that activates other devices, such as a home security system.

In one embodiment, an infrared (IR) switch configured to attach to an insulated window (low e-glass) emit IR radiation through the insulated window. A trigger area is formed on the non-mounted side of the window, wherein the emitted radiation may be emitted back into the IR switch. The IR switch may be comprised of: an adhesive layer configured to attach to a window surface; a PCB layer connected to the adhesive layer; an IR emitter connected to the PCB layer; an IR sensor connected to the PCB layer; a calibration unit connected to the IR sensor; and an overlay layer connected to the PCB layer, wherein a portion of the overlay layer is transmissive to IR radiation in the range of 780-1000 nm.

In another embodiment, an IR switch may incorporated into a display system that is mounted to one side of insulated glass (in particular low e-glass). A user may interact with the display system by touching trigger areas on the non-mounted side of the insulated glass. In some embodiments, the display system may be comprised of two emitters and one sensor for every trigger area formed. The display system may also comprise a computing device that receives and processes information from the IR switch, sends an output to a visual display and may also be configured to receive information from another input device such as a removable storage device, network, internet, or wireless device.

Figure 1:
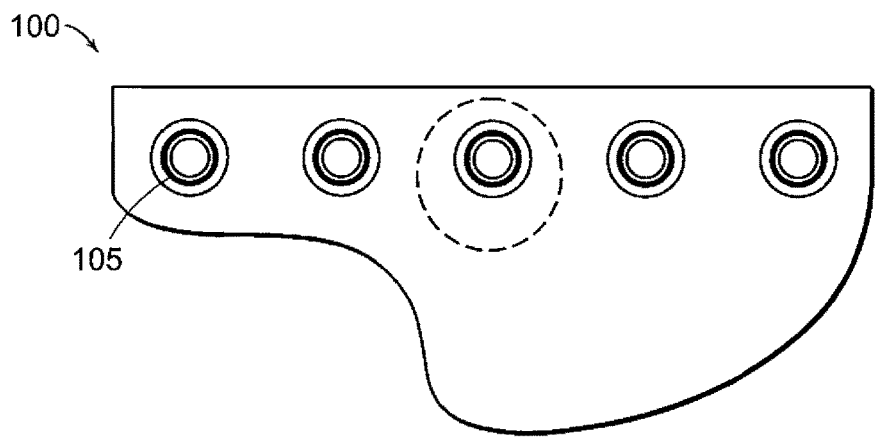
FIG. 1 shows an illustrative diagrammatic view of an interface system of the present invention.
Figure 2:
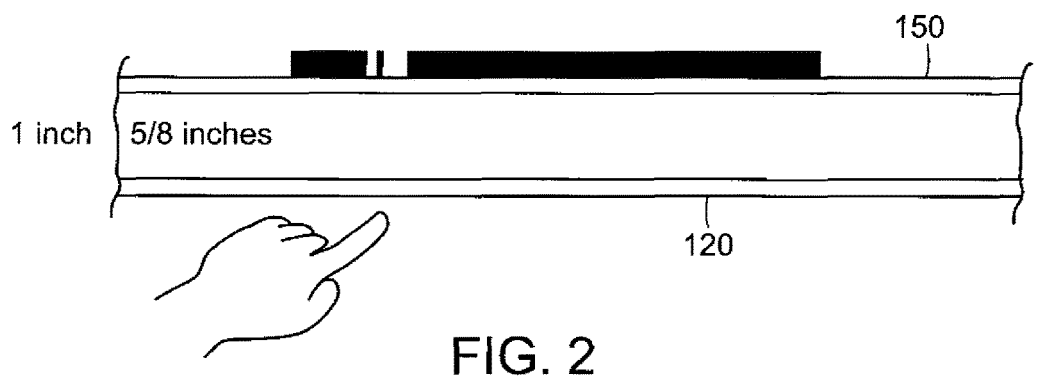
FIG. 2 shows an illustrative diagrammatic side view of the interface system of FIG. 1 mounted on a window.

FIG. 1 illustrates an IR mountable switch 100 having five trigger areas 105. The IR switch 100 is shown mounted on one side of a window 150 (as shown in FIG. 2) and creates a reflective or interactive zone 120 at or near the opposite surface to which the IR switch 100 is mounted. This interactive zone allows a user to touch or place their finger or hand near the surface of the window wherein IR radiation emitting from the IR switch is reflected back into 100 and detected by a sensor (see FIGS. 12-15). It is contemplated that multiple trigger areas could be generated based on each interactive display systems' specifications. The communication with the device may be bidirectional, and may for example, provide that when the system detects a valid activation signal, a ring around the button that was activated becomes lighted or changes color, indicating to the user that the switch was successfully activated.

Figure 3:
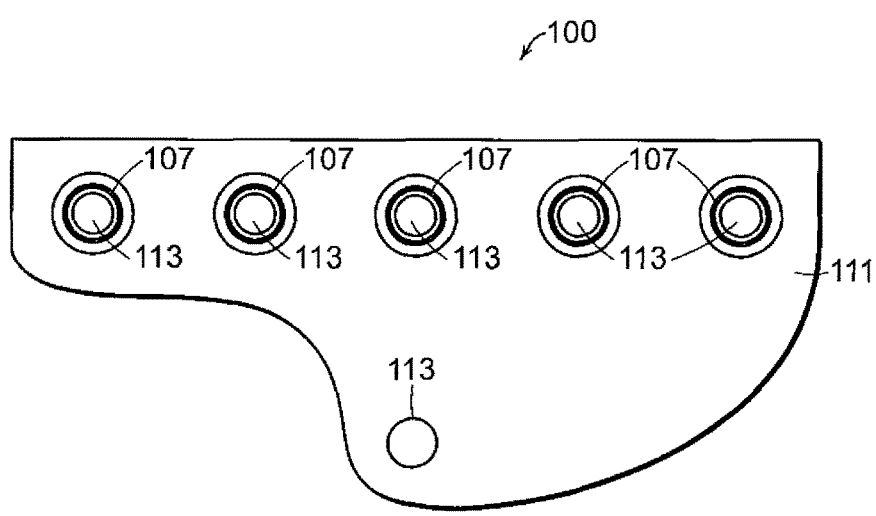
FIG. 3 shows an illustrative diagrammatic view of the transmissive layers of the system of FIG. 1.

FIG. 3 shows an embodiment of an IR switch 100 where the trigger area has various opaque and translucent portions to allow various wavelengths to pass through. In some embodiments additional internal emitters emitting visible are activated when a user activates the trigger with various lights. The display system may also light up certain trigger areas indicating certain trigger areas are active. The various colors include translucent blue 107, opaque blue 111, and translucent IR filter 113. Further colors such as opaque red may also be used to provide coatings or other layers having unique opaque or translucent qualities.

Figure 4:
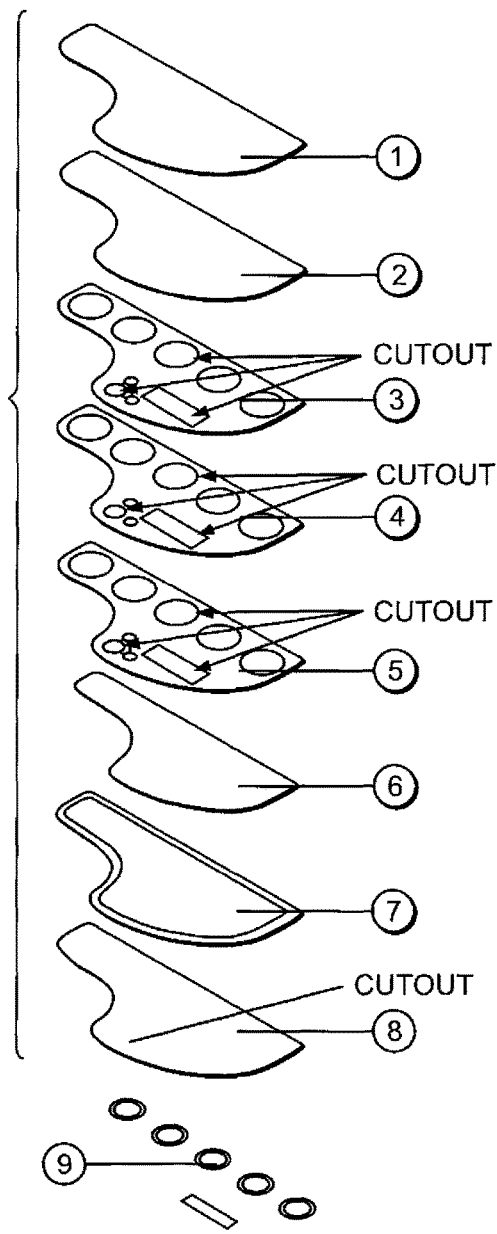
FIG. 4 shows an illustrative assembly view of the component parts of the interface system of FIG. 1.

FIG. 4 shows an exploded view illustrating the various non electrical layers of an IR mountable switch. The various layers include adhesive layers 1, 3 and 5, overlays 2 and 8, spacers 4 and 5, PCB reference 6, gasket 7 and reflective PET 9, as well as cutouts in overlay 3, spacer 4, spacer 5 and cutout 8 that make up the product package. Materials used to control spacing of the PCB assembly to the optimum distance to the e glass and block ambient light and radiation from the back side of the assembly. As discussed more below, having a sufficient gap in the layers to emit and receive the reflected emissions is important to the functionality of the IR switch. Additionally, in some embodiments light/radiation barriers are positioned within these layers to prevent over saturation of the sensors. In some cases, these barriers may also serve a second purpose such as a capacitor, transistor or electrical component used in the IR switch. Placing electrical or PCB components used to control and process the emitters, sensors and received signals at various positions within a multi-layered IR switch system is one of creating light/radiation barriers.

Figure 5:
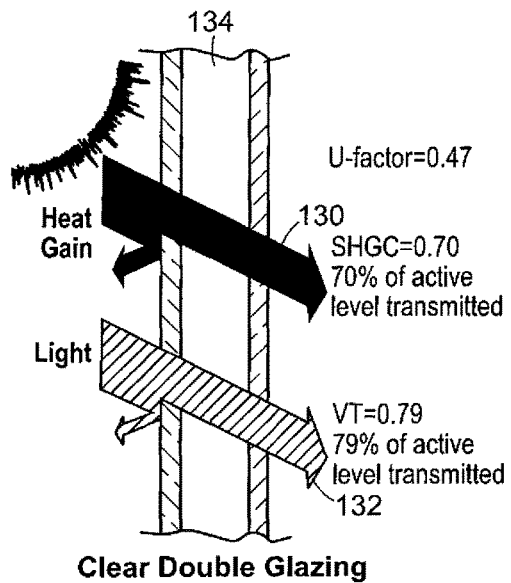
FIG. 5 shows an illustrative diagrammatic view of transmission in a clear window with double glazing.
Figure 6:
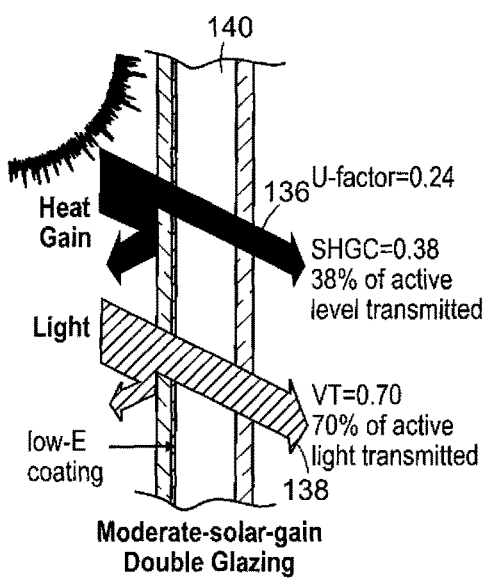
FIG. 6 shows an illustrative diagrammatic view of transmission in a window with moderate solar-gain and double glazing.
Figure 8:
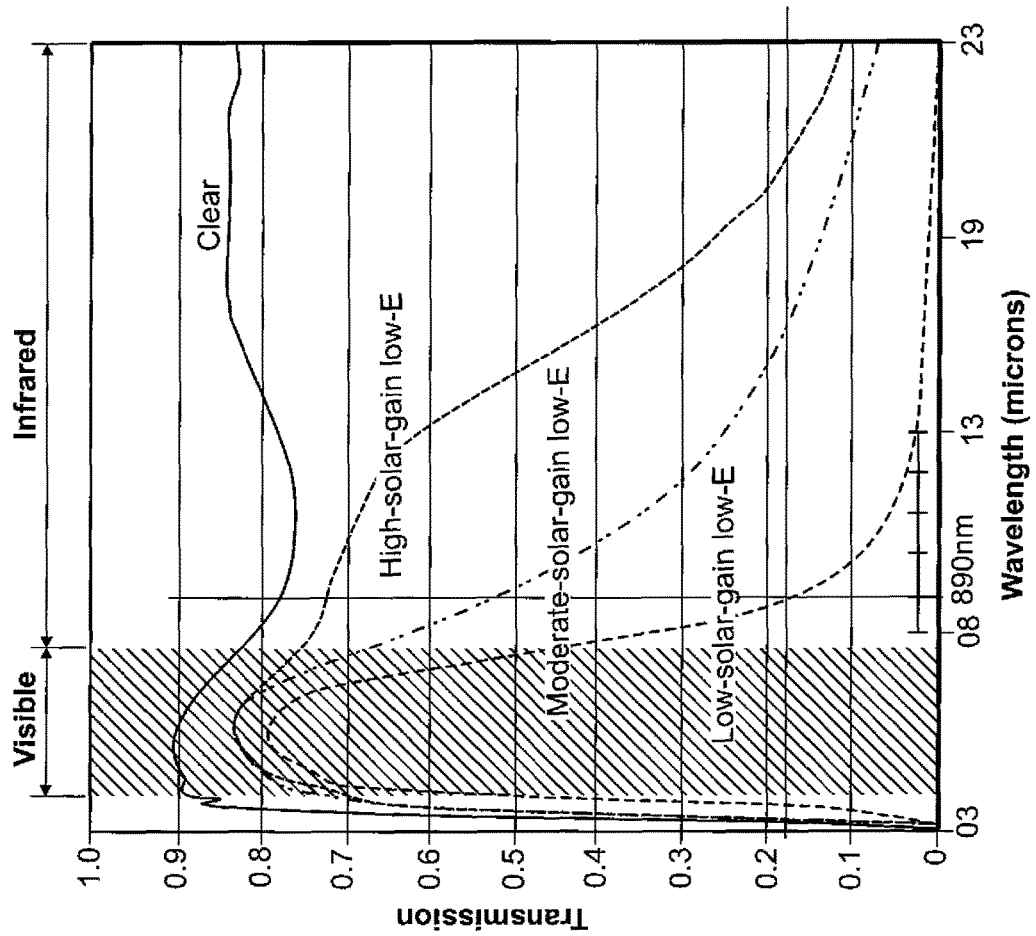
FIG. 8 shows an illustrative graphical representation of wavelength verses transmission for a variety of windows.
Figure 7:
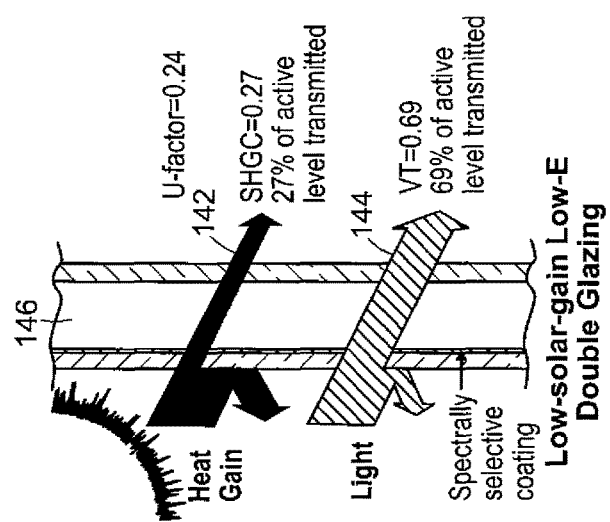
FIG. 7 shows an illustrative diagrammatic view of transmission in a window with low solar-gain, low-E and double glazing.

FIGS. 5-7 show various properties of insulated windows. As shown at 130 and 132 of FIG. 5, much heat gain and light pass through a double pane window 134. As shown at 136 and 138, significantly less heat gain enters a moderate solar-gain double glazing window 140, while still allowing significant light through the window. As shown at 142 and 144, eve even less heat gain enters a low-solar-gain, low E double glazing window 146, while still allowing significant light through the window. As shown in FIG. 8, different windows allow various amounts of light/radiation through in the visible and IR ranges. One particular wavelength, 890 nm, as shown in FIG. 8 illustrates how much of that particular wavelength will be transmitted using various insulated windows. This ranges from almost 80% being transmitted with clean non-insulated glass to below 20% for low-solar-gain and low-e glass.

FIGS. 9A and 9B show a table of various properties of a variety of insulated windows used in the industry. As mentioned above, it is important to have an interactive display system that can be used with the various industry-wide type of insulated windows. In particular, managing the transmissive properties that may be high or low with respect to each window. In one configuration, firmware connected to the IR switch allows the emitters and sensors contained therein to be calibrated respective to each transmissive surface. Calibration may include adjusting the sensitivity of the sensors to ignore certain ambient levels that are present with each interactive display system. The calibration may include adjusting power output of the emitters, frequency or pulsing of the emitters, and even the number of emitters required for each sensor. Pulsing the emitters at various frequencies may aid in distinguishing the emitters from ambient IR light/radiation.

In some embodiments it is important to use multiple emitters with slightly increased power output to enlarge the trigger area generated at the reflective zone 120. In one embodiment two emitters are used for every one sensor to create one trigger area in the reflective zone. Numerous combinations of emitters and sensors may be used in different embodiments.

Figure 10:
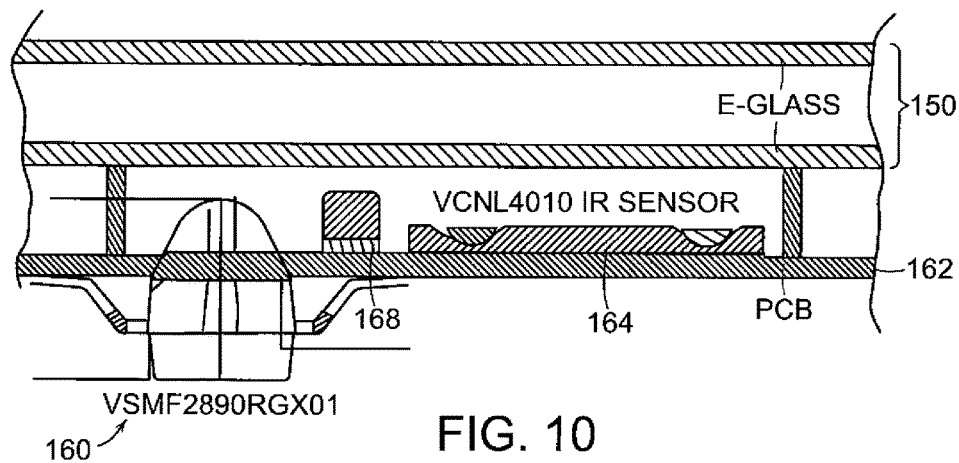
FIG. 10 shows an illustrative diagrammatic view of apportion of an input system in accordance with an implementation of the invention.
Figure 11:
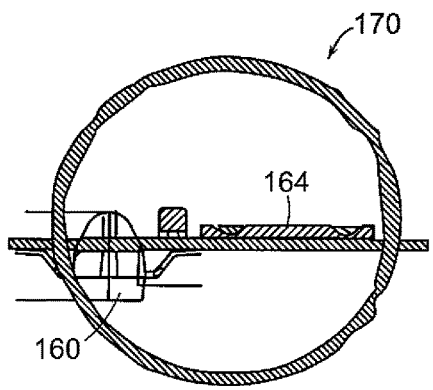
FIG. 11 shows an illustrative diagrammatic view of a portion of the system of FIG. 10.
Figure 12:
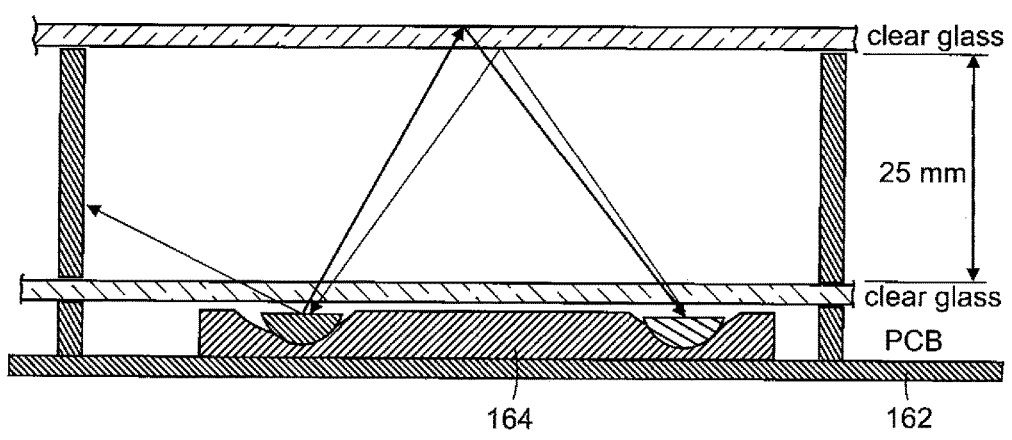
FIG. 12 shows an illustrative diagrammatic view of an implementation of a system of the invention as used with two clear glass panes.
Figure 13:
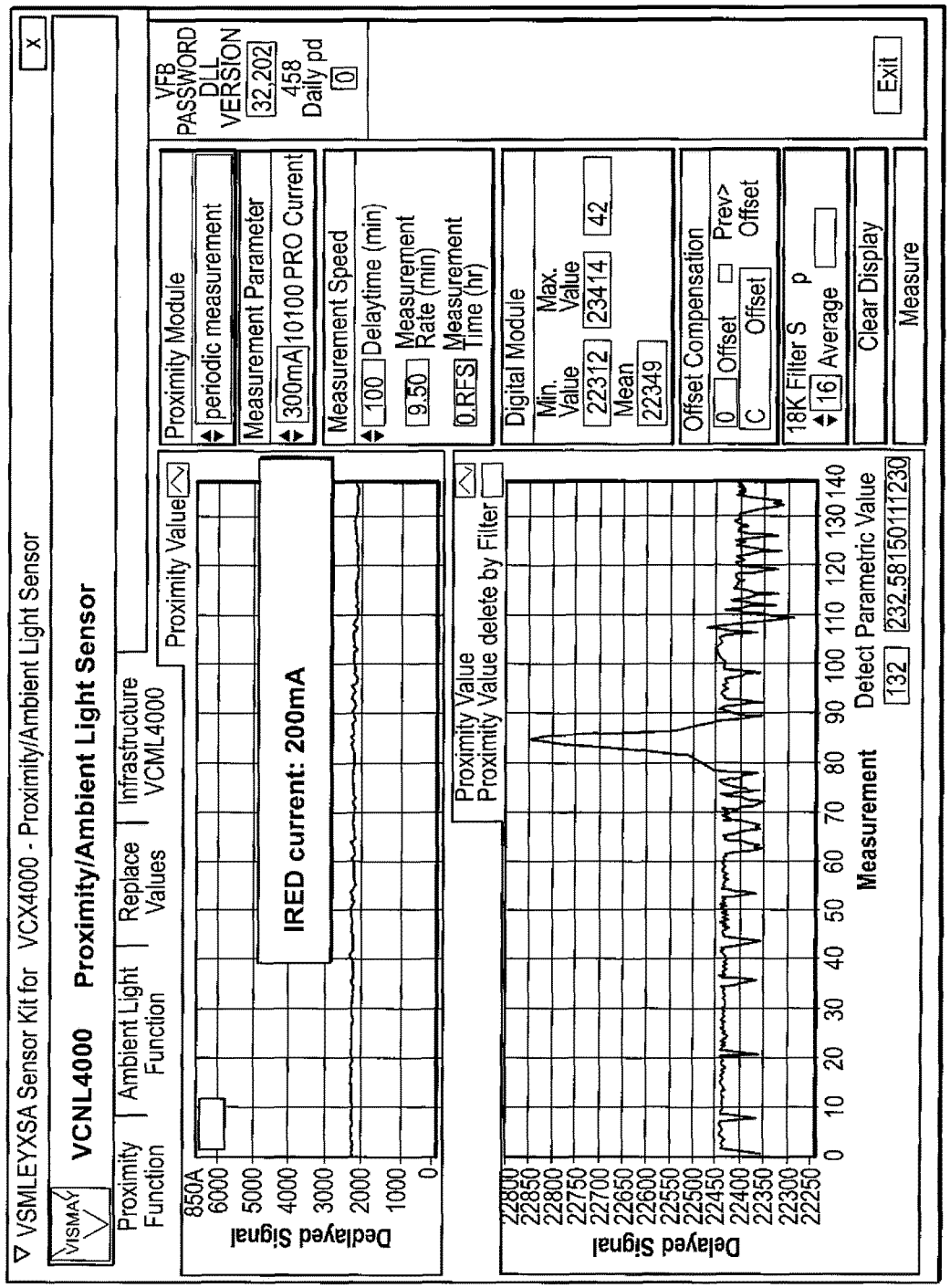
FIG. 13 shows collected data associated with the system of FIG. 12.
Figure 14:
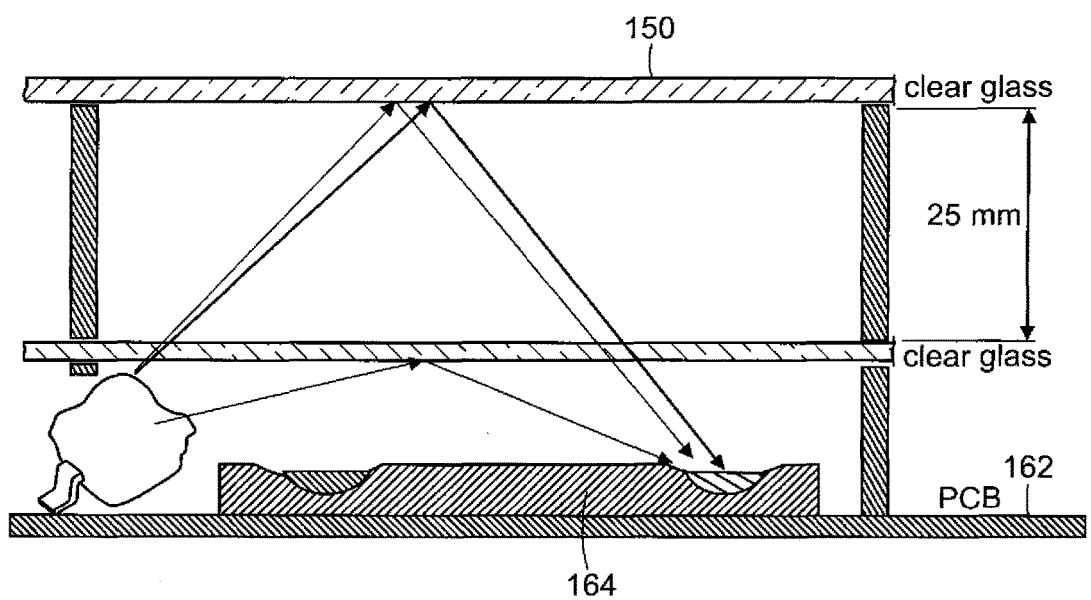
FIG. 14 shows an illustrative diagrammatic view of an implementation of a system of the invention as used with two tinted glass panes.
Figure 15:
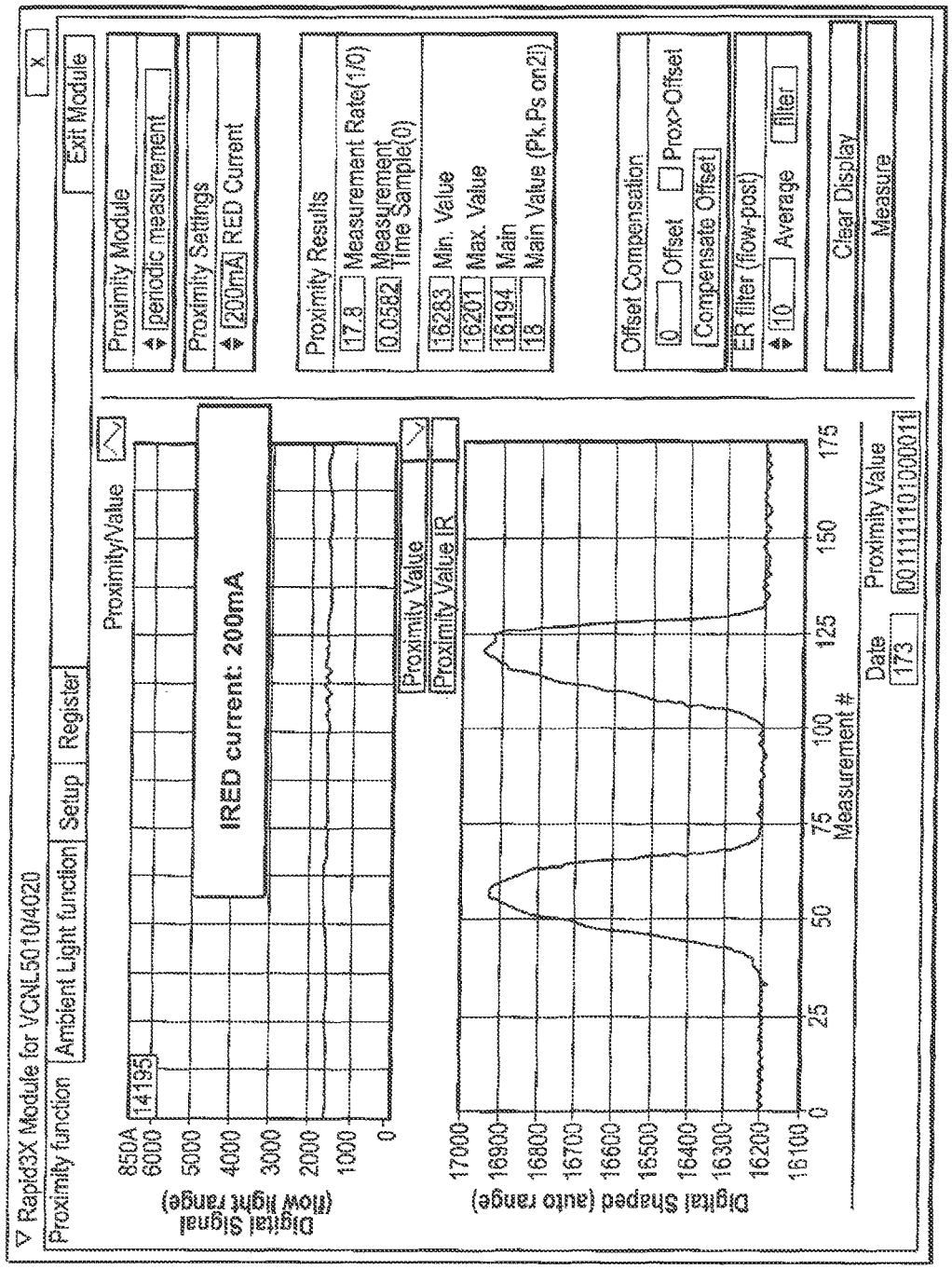
FIG. 15 shows collected data associated with the system of FIG. 14.

FIG. 10 shows a schematic of an IR emitter 160 and IR sensor 164 mounted to a PCB board 162 within a mountable IR switch system. In this configuration a decoupling capacitor 168 is placed between the sensor and emitter to also serve as a physical light/radiation barrier between the two. If too much light/radiation is received into the sensor saturation may occur, which renders the system unworkable. However, as discussed above the emitters need to generate enough power to transmit through certain types of windows having low transmittance in the IR range, such that the reflected signal from a user's hand or finger may still be detectable at the sensor. Thus, certain features within the IR switch function as light/radiation barriers to ensure scattering of light/radiation does not adversely affect the sensor. The e-glass often reflects a substantial amount of emitted IR radiation back into the IR switching device, thus barriers and positioning of the emitters and sensors within the IR switch are important to preventing too high of noise levels. As shown, an LED emitter 160 may be used together with a combined emitter sensor unit 164, such as the VCNL 4010 device sold by Vishay Intertechnology, Inc. of Malvern, Pa. FIG. 11 shows at 170 the relative size of a overlying button image in accordance with an embodiment. It will be appreciated that the button area is relatively large, which will require calibration as discussed below.

One of the wavelengths discussed above 890 nm is used in one configuration; however, a preferred range of wavelengths to be used in this system range from 780 nm to 1000 nm. This is often called the near infrared (NIR) range. Ranges below this are in the visible light range and those above are often heavily blocked by the various types of coatings, thicknesses and multi-pane windows used in the industry.

Preferably, the IR sensor device of the present invention is calibrated. Preferably, the lights on the at least one button indicate the status of the calibration and provides instructions. In further embodiments, the device may be calibrated remotely as discussed in more detail below with reference to FIGS. 22 and 23. A method of calibrating the IR detector for use in certain glass is by using the following steps.

With reference to FIGS. 12-15, IR radiation is detected at wavelength 890 nm transmitted through two layers of clear glass 150 having a gap in between and another transmission/detection occurring through two coated layers of glass having a gap in between. For each configuration, the amount of ambient light/radiation reaching the sensor differed and individual calibration to set the sensitivity threshold accordingly. In the clear glass configuration (FIG. 12) the ambient IR light/radiation was much higher, but did not saturate the sensor. In the coated/tinted glass configuration (FIG. 14) the ambient IR light/radiation detected by the sensor was lower; however, the sensor was still able to detect reflected light/radiation back into the sensor from the trigger area on the reflector zone.

It should be noted that the IR emitter transmits IR radiation through the glass. The opposite side of the glass remains uncovered i.e. no reflector (such as a finger surface) is placed on the opposite side of the glass, while the system is calibrated for ambient light/radiation. The IR detector determines the level of IR radiation received which represents the off count/ ambient (no touch) value, which may also be called a first count value.

Because some IR radiation scatters for instance due to the glass or possibly directly from the emitter to the IR detector, and then arrive at the IR detector, IR radiation might be detected by the IR detector. The IR detector will measure the IR radiation (which might be present even without a reflector on the opposite side of the glass). The level of IR radiation received by the IR detector without an IR reflector in place is called the off count/ambient count value or the first count value.

The IR emitter emits IR radiation through the glass. An IR reflector (such as a finger surface) is placed on the opposite side of the glass, preferably in the reflector zone. The IR radiation is reflected back through the glass by the IR reflector to the IR detector; and the IR detector determines the level of the reflected IR radiation which represents a second count value, the reflected (touch) value.

The difference (delta counts) between the second count and the first count value is determined and this delta value is used to set the trigger point. The IR detector is then calibrated using this delta count value and the acceptable sensitivity (false positive and false negative responses).

It will be understood that the IR sensor device may also be calibrated by using the presence of the reflector as the off count/ambient value and removing the reflector as the trigger. In that case the difference will be a negative reading which can be processed as such and/or as using the absolute value thereof.

A trigger point (based on the delta counts) may be programmed into the firmware of the IR switch to determine whether a reflector is present based on the IR radiation detected by the IR detector. Preferably the trigger count point is set at a level of at most the difference between the second value (in absolute value) and the first value (in absolute value) and more preferably at most 80% less than then difference, more preferably at most 50% for instance at 10% less. During calibration, the system may poll all sensors and then trigger a decision based on aggregate information using a variety of approaches such as determining which sensor detected the highest delta values as discussed in more detail below.

Figure 16:
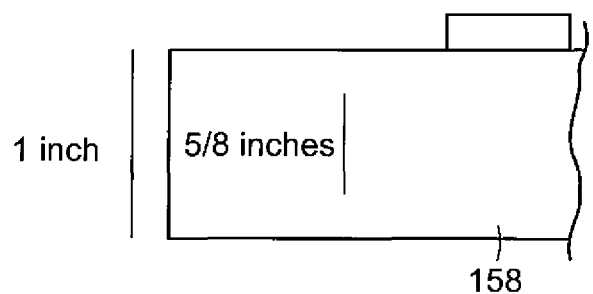
FIG. 16 shows an illustrative diagrammatic view of a portion of a double pane window of use in an implementation of a system of the invention.
Figure 17:
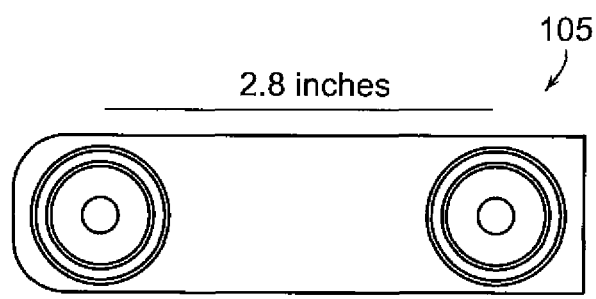
FIG. 17 shows an illustrative diagrammatic view of portion of an input system of an embodiment of the invention.
Figure 18:
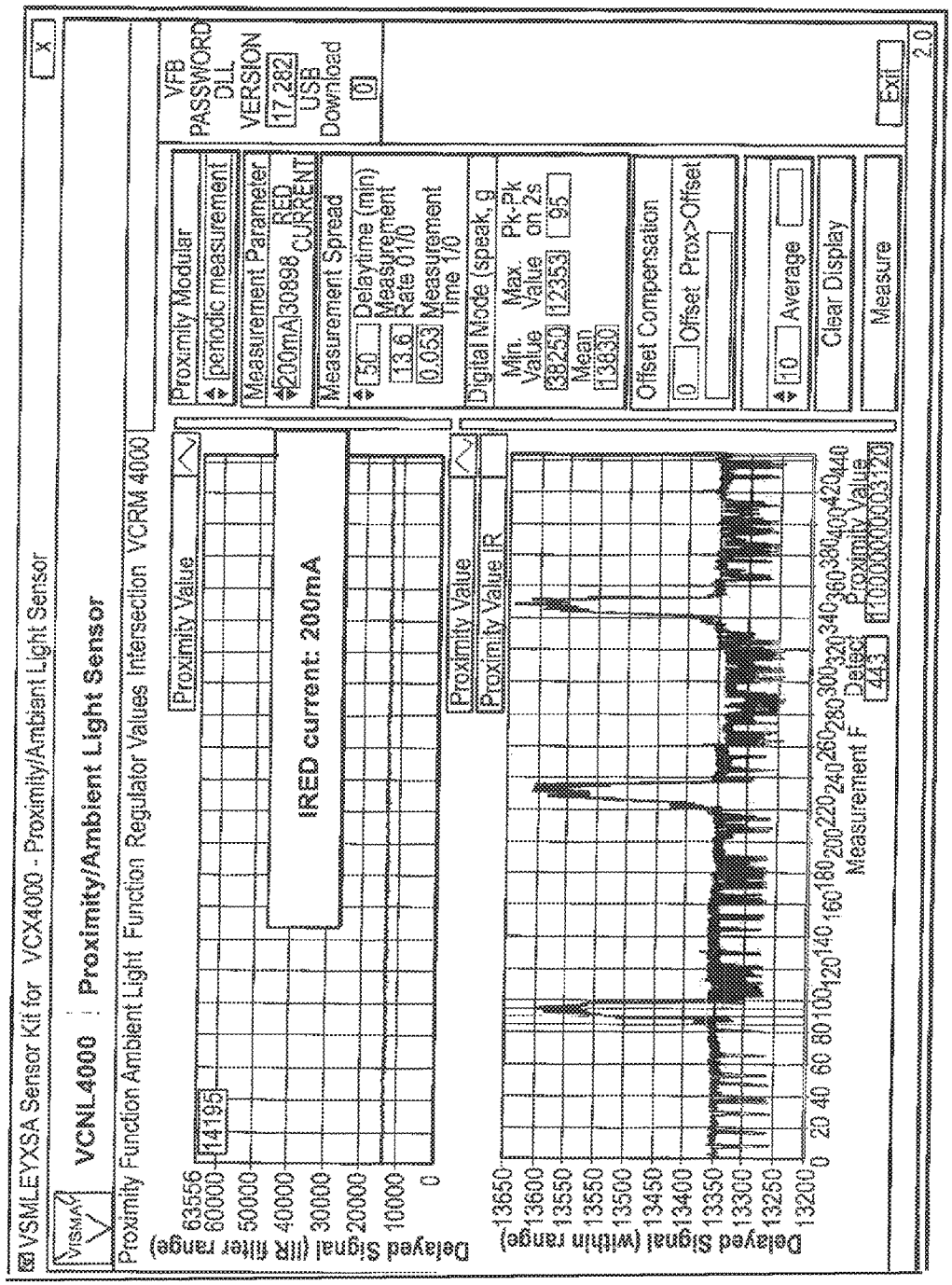
FIG. 18 shows an illustrative diagrammatic view of data associated with the system of FIG. 16.

With reference to FIGS. 16-18, a setup having two sensors 105' placed approximately 15 mm apart was employed to detect for interference or scattering of radiation between each. In this test, some of the ambient light/radiation increased, but still remained below the saturation level. A calibration was able to determine that a finger touch resulted at change of about 300 counts. In accordance with various embodiments, the system may continuously sample the input (as IR radiation from the environment changes through the day), and may further monitor potential activation of all buttons to determine whether a spike is localized at one button or is present among all input buttons (indicating a false trigger).

Further, in certain embodiments, the pulse rate of the IR source(s) may be controlled and this timing of the pulse rate may be used by the detector to effectively filter out IR from outside the window. In further embodiments, each of the buttons may include a modulated source at a different pulse rate to enable filtering out radiation from neighboring sources.

Figure 19:
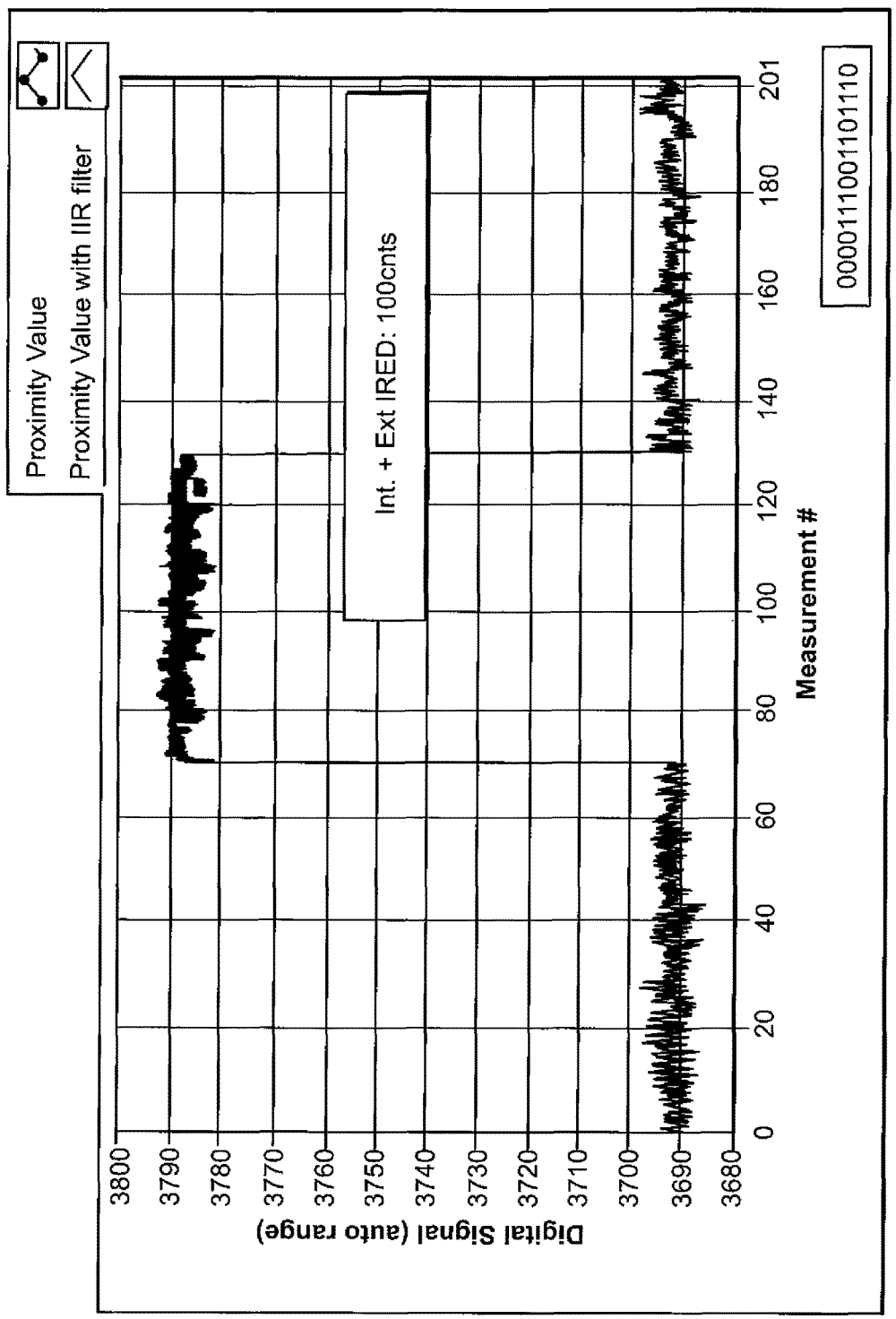
FIGS. 19 and 20 show a illustrative diagrammatic views of data associated with a system of the invention used with e-glass windows.
Figure 20:
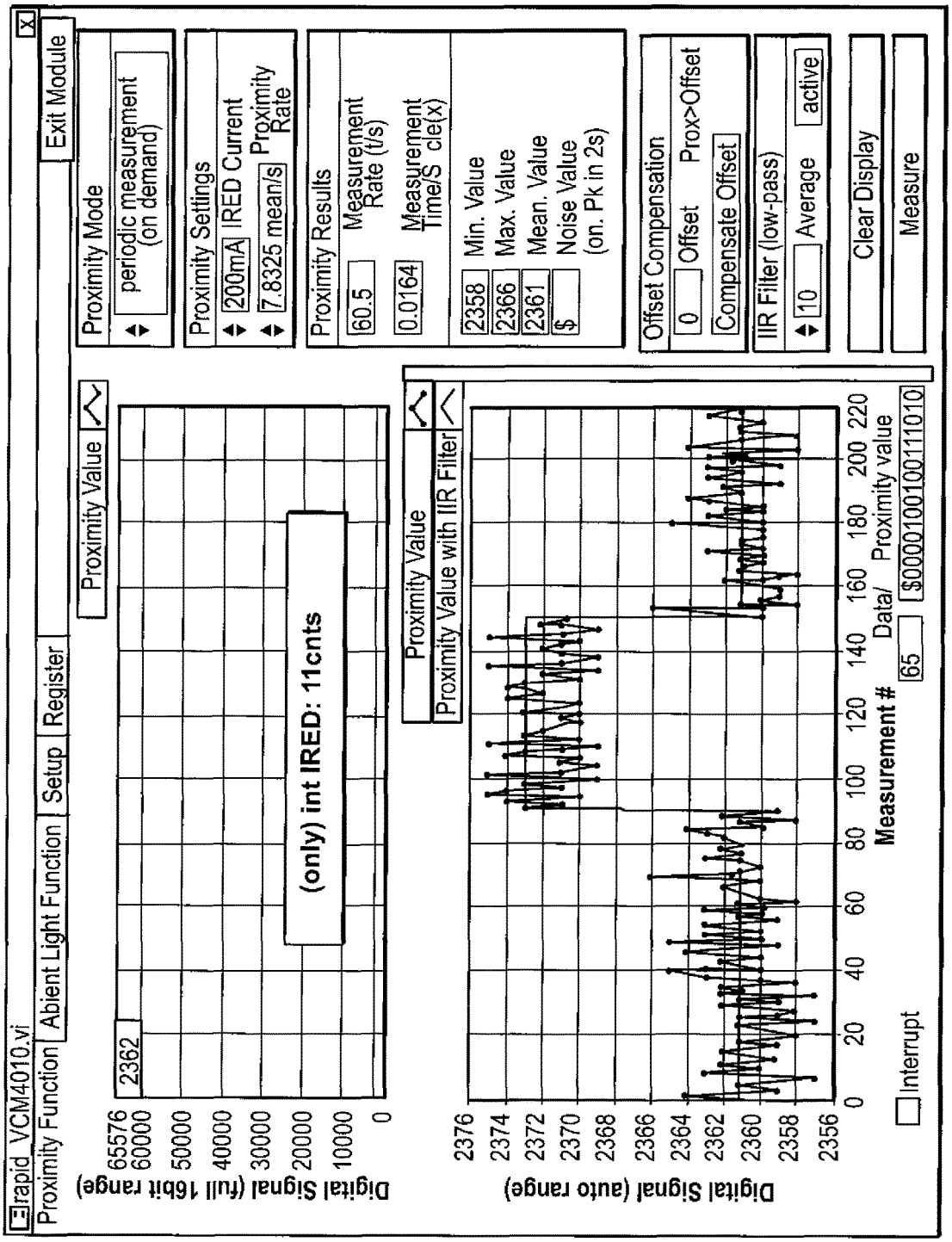

FIGS. 19 and 20 show results of recognizing low signal or counts being received by an IR switch. In some instances only a very small signal is read through the e Glass by the sensor. In one embodiment the firmware is programmed with a methodology (implemented in part by software) to allow the sensor to read a signal, determine if it is a trigger and implement a switch function. The switch function then being sent to the computing device that controls the interactive display system or other function.

Due to the verity of e Glass window constructions and materials, in some embodiments, a custom calibration program is built into the IR switch (and/or the complete interactive display system) and used at each site to be used. The calibration sets or customize the levels of sensitivity and filtering for when the switching function parameters are triggered.

Other examples of IR mountable switch configurations include an IR sensor device VCNL2010 (sold by Vishay Intertechnology, Inc.) comprising an IR emitter (called "an internal IRED) and an IR detector is combined with a second IR emitter (called "an external IRED") coded VSMF2890RGX01 which has a radiant intensity of 40 mW/sr. The button areas comprise black ink (Teikoku's MRX IR Black ink, single layer). The IR sensor device with painted button areas is glued against various glass set-ups in the configuration as shown FIG. 3. For each glass set-up, the IR sensor device is calibrated using the above procedure. The reflector zone is set to about 2 cm$^2$. The following experiments were conducted and the results indicated were obtained for the various glass types tested.

EXAMPLE 1

The above mentioned IR sensor device VCNL2010, but without the external IRED emitter was adhered to the glass (with the emitter placed 1 mm in front of double pane glass), consisting of two panes of regular clear glass (the panes were 25 mm apart) with a U factor of 0.47 Btu/h·ft2·° F. and an SHCG of approximately 0.70. The IR sensor emits (peak wavelength) and detects IR radiation of 890 nm and is modulated at the defined carrier frequency of 390.625 kHz. The applied current was 200 mA and a measurement rate of 9.5/s and measurement time of 0.105 s was used. The measured off set counts were around 24450. The delta counts (recognition of a finger touch on the other side of the glass) reached 400 counts.

This example shows that IR sensor device of the invention allows for accurate user interfacing through two panes of regular glass in a retail store setting.

EXAMPLE 2

The above mentioned IR sensor device VCNL2010 was combined with the above mentioned external IRED emitter VSMF2890RGX01 and adhered to (with the emitters placed at a distance of about 3 mm) double pane, heat insulating, transparent glass consisting of two panes of tinted glass with 75% transmission for 890 nm. The panes were placed 25 mm apart. The IR sensor device emits (peak wavelength) and detects IR radiation of 890 nm which is modulated at the defined carrier frequency of 390.625 kHz, receives an applied current of 200 mA for the IRED and has a measurement rate of 17.8/s and measurement time of 0.0562 s. The measured off set counts were around 16200. The delta counts (recognition of a finger touch on the other side of the glass) reached 700 counts. The same test was done without the external IRED emitter, with 18.4/s measurement rate and 0.0543 s measurement time. The measured off counts were about 17850 and the delta counts (recognition of a finger touch on the other side of the glass) of 200 counts.

This example shows that IR sensor device of the invention allows for accurate user interfacing through tinted double glazed glass in a retail store setting.

EXAMPLE 3

The above mentioned IR sensor device VCNL2010 (without the above mentioned external IRED emitter VSMF2890RGX01) was adhered to a vertical, double pane, heat insulating, transparent glass window with total width of 15 mm, a U factor of 0.47 Btu/h·ft$^2$·° F. (the US standards) and an SHCG of 0.70. The IR sensor device emits (peak wavelength) and detects IR radiation of 890 nm with an applied current of 200 mA with a measurement rate of 18.6/s and measurement time of 0.0538s. The infrared radiation was modulated at the defined carrier frequency of 390.625 kHz. The measured off set counts were around 13350. The delta counts (recognition of a finger touch on the other side of the glass) reached 300 counts.

This example shows that IR sensor device of the invention allows for accurate user interfacing through double glazed glass in a retail store setting.

EXAMPLE 4

The above mentioned IR sensor device VCNL2010 in combination with and without the above mentioned external IRED emitter VSMF2890RGX01 was adhered to vertical, low e, low solar gain, double glazing, heat insulating, transparent glass of 1 inch (2.5 cm) thickness and with about 17% transmission at 890 nm comprising a metal based coatings (as well as several layers of protective coating), having a U factor of 0.30 Btu/h·ft2·° F. (USA standard unit), an SHCG factor of 0.30 and a VT of 0.7. The IR sensor device emits (peak wavelength) and detects IR radiation of 890 nm with an applied current of 200 mA for the IRED and with a measurement rate of 60.9/s and measurement time of 0.0164 s. The infrared radiation was modulated at the defined carrier frequency of 390.625 kHz. The measured off set counts without the external IRED were about 2361. The delta counts (recognition of a finger touch on the other side of the glass) reached 11 counts. The measured off set counts with the external IRED were about 3690. The delta counts (recognition of a finger touch on the other side of the glass) reached 100 counts.

This example shows that by including an external IRED in the IR sensor device of the invention, a more accurate user interface device is obtained when using low e, double glazed glass in a retail store setting, other working office building and so forth.

Comparative example

A capacity proximity sensor device that is said to work across 1 inch double glazing did not give any reading when the finger touches the other side of the low e glass of example 4.

It has been determined that the IR sensor device of the invention provides for functions properly and provides accurate readings in the above circumstance through various glass layers, even including low e glass (which aims to block IR radiation). The IR sensor device may be used in public spaces in a tamper-proof manner and when placed vertically. The IR sensor device set-up is easy and inexpensive. The comparative example shows that capacitive proximity sensors surprisingly do not function when used with low e glass, while the IR sensor device of the invention does function and provides precise measurements. Cross talk and digital noise may be present, but the IR sensor device of the invention provides for an accurate user interface to direct a computer with display that is located on the opposite side of a glass window. The invention does not require inconvenient adjustments to the glass window, the window frame or the surrounding building and can be easily installed while the entire set-up remains tamper-proof.

Figure 21:
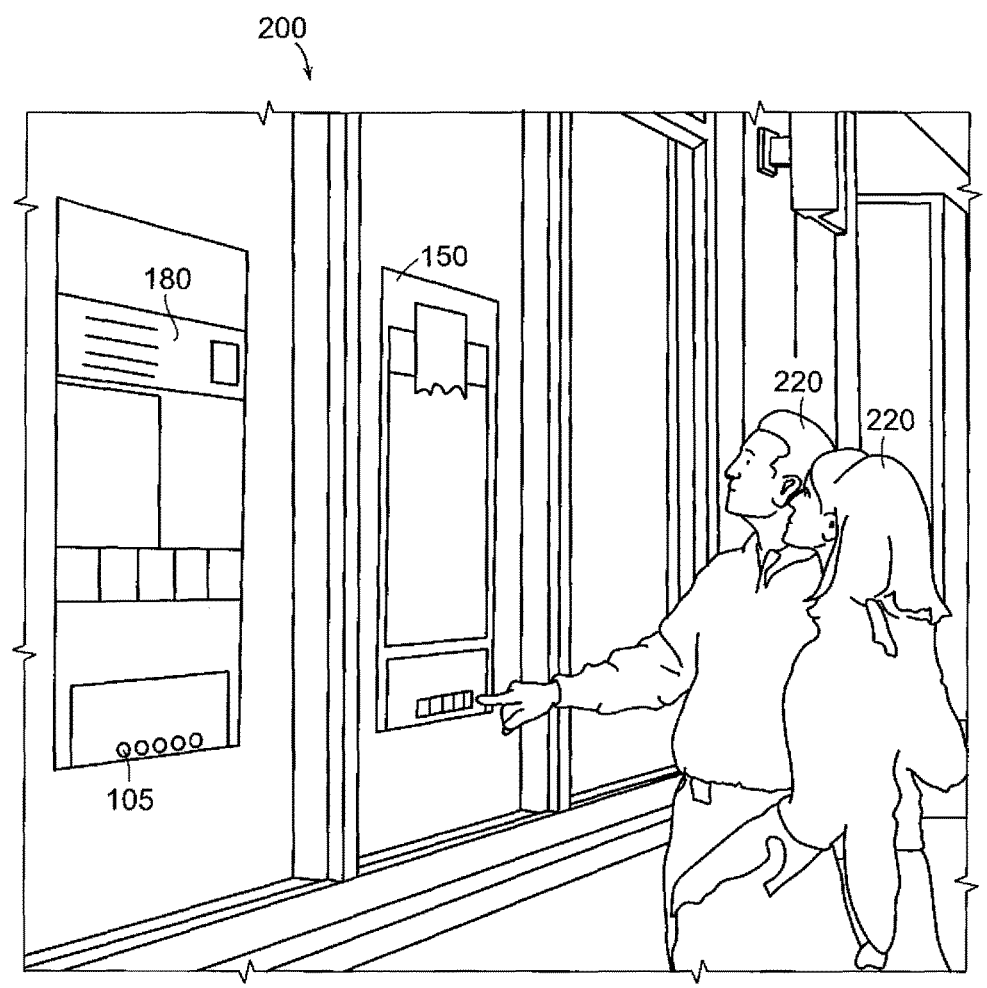
FIG. 21 shows an illustrative view of a system of the present invention with display devices.

FIG. 21 shows an interactive display system 200 in accordance with an embodiment. System 200 is comprised of a visual display 180 which is operated by a computer. The computer or processing unit receives an input or signal from the IR mountable switch when users 220 interact with trigger area 105. This interaction causes an IR signal emitted from the IR switch to pass through window 150, be reflected at the trigger area 105 and pass back through window 150 where a sensor detects the emission. The interaction may include placing a hand, finger or other IR reflective object over or in front of the trigger area.

Information displayed on the Interactive Display system 200 may be contained on the computer driving the display or received through a wire or wireless connection to another computer, server or the internet. One advantage of placing Interactive displays systems behind a glass window is they become tamper-proof. Dynamic and Interactive displays often draw users to spend more time in front of the display and provide more opportunities to sell a service or product to a user. They may even allow time for and alert a salesman such as a real estate agent that a particular user/consumer may be interested in a service or product, so they can have an in-person meeting. Interactive display systems may be used to disseminate information to the public and particularly persons who pass by a particular venue where the interactive display system may be displayed.

Figure 22:
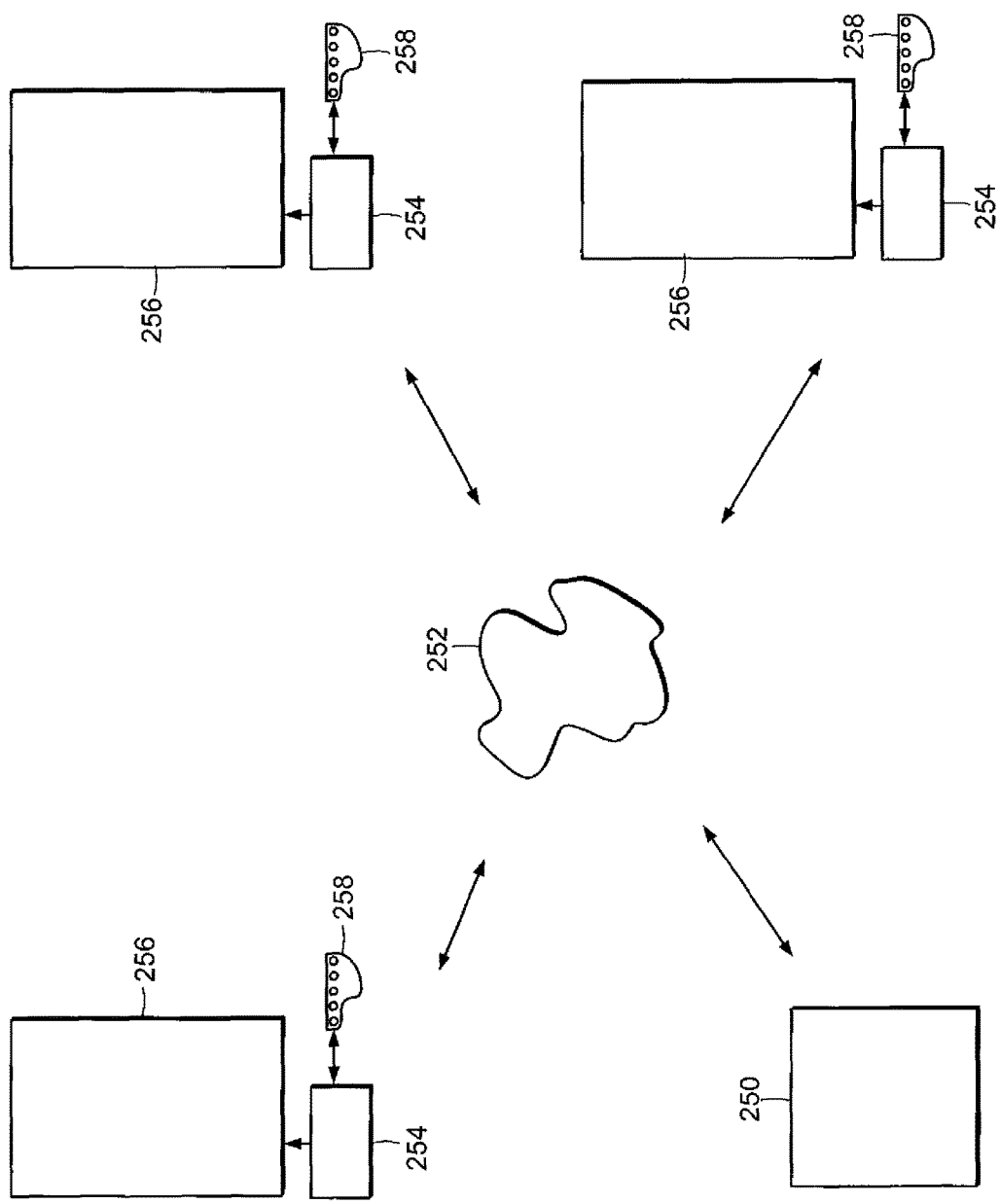
FIG. 22 shows an illustrative diagrammatic view of a network of interactive display devices in accordance with an embodiment of the present invention.
Figure 23:
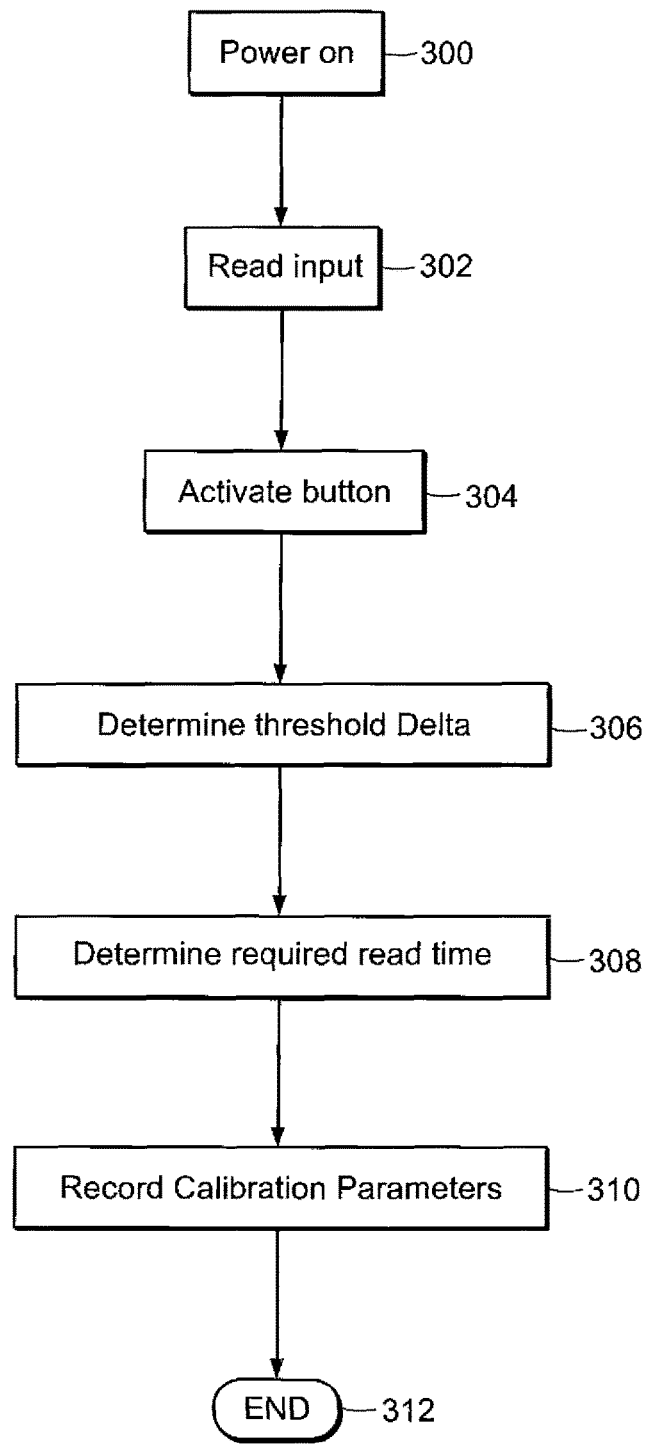
FIG. 23 shows an illustrative diagrammatic flow diagram of a calibration process in accordance with an embodiment of the present invention.

As shown in FIG. 22, a system in accordance with a further embodiment of the invention may provide that a central computer 250 may communicate via either a hardwired or wireless wireless network (such the Internet), to a plurality of different interactive display systems by communicating with the computer 254 of each, which is in communication with both an associated display 256 and input device 258 as discussed above. Each of the local systems is as disclosed above, where the input device 258 has bidirectional communication with a local computer 254 for driving a display device 256. Using such a network system, the local systems may be monitored, repaired via troubleshooting and even calibrated remotely when first set up.

As discussed above and with further reference to FIG. 23, a calibration process (whether remotely triggered or conducted upon installation) may involve first powering up the device (step 300), reading the steady state input (step 302), and then reading the input upon activation of the button (step 304). The system then determines an appropriate threshold delta between activation and steady state (step 306), and also determines a required read time (step 308). If the system sees a sharp, well defined delta, the threshold may be high and the required read time may be low. If, on the other hand, it is difficult for the system to determine the activation, the threshold may be lowered and/or the read time may be extended, requiring a user to hold their finger at the button spot for a slightly longer period of time. The system then records the calibration parameters (step 310) and then ends (step 312) or is repeated for each of the simulated buttons on the device. These techniques permit the system to be robust in a wide variety of applications, environmental conditions, and suitable for use a wide variety of e-glass.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawing are by way of example only.

What is claimed is:

1. A method for operating an interface device on a retail storefront with low emissivity glass, the method comprising:
  providing the interface device mounted to a first surface of the low emissivity glass with all components of the interface device inside the retail storefront and opposite a second surface of the low emissivity glass outside of retail storefront, the interface device comprising a plurality of infrared(IR) mountable switches each comprising:
    at least one infrared (IR) emitter configured to emit IR radiation through the low emissivity glass; and
    at least one IR sensor configured to detect a reflection of the IR radiation through the low emissivity glass;
  generating, using emitted IR radiation transmitted directly through the low emissivity glass by the at least one IR emitter, at least one trigger area with a reflective zone on the second surface of the low emissivity glass opposite the first surface and at a location substantially opposite the at least one IR emitter of the interface device;
  wherein the at least one IR sensor is calibrated to detect reflection of IR radiation reflected back through the low emissivity glass by an IR-reflective object when the at least one IR emitter emits the IR radiation through the low emissivity glass;
  detecting, by the at least one IR sensor, a no touch value of IR radiation when no object is in front of the reflective zone, the no touch value comprising a measured value of IR radiation caused by ambient light;
  detecting, by the at least one IR sensor, a touch value when the IR radiation emitted from the at least one IR emitter impacts the IR-reflective object located at the reflective zone and reflects back through the low emissivity glass in the reflective zone to the at least one IR sensor, the touch value of IR radiation being greater than the no touch value of IR radiation;
  wherein the at least one IR sensor both emits and detects IR radiation in a combined configuration working in conjunction with the at least one IR emitter;
  wherein the at least one emitter, the at least one IR sensor and printed circuit board (PCB) components are placed within a multi-layered system further comprising at least one decoupling capacitor placed between the least one IR sensor and the at least one IR emitter as a physical radiation barrier between the at least one IR sensor and at least one IR emitter; and
  providing the touch value as a signal input to an interactive display device.

2. The method as claimed in claim 1, wherein the low emissivity glass has a U value of 0.47 Btu/h·ft$^{2}$·° F. or lower, such that the plurality of infrared (IR) mountable switches are activated through the retail storefront heat insulating glass of various glass layers including low emissivity glass which aims to block IR radiation due to emissivity requirements of many windows in certain retail storefront applications.

3. The method as claimed in claim 1, wherein the low emissivity glass has an SHGC of 0.70 or lower.

4. The method as claimed in claim 1, wherein the retail storefront low emissivity glass is heat insulating glass with a metal based coating.

5. The method as claimed in claim 1, wherein the low emissivity glass has multiple panes through which the IR radiation is reflected, and wherein the method further comprises calibrating the plurality of IR mountable sensors to be calibrated for the low emissivity glass, adjusting a sensitivity of the plurality of IR mountable sensors relative to ambient levels.

6. The method as claimed in claim 1, wherein the IR radiation intensity of the IR emitter is at least 10 mW/sr.

7. The method as claimed in claim 1, wherein the low emissivity glass is tinted and is positioned vertically.

8. A user interface device for use with a low emissivity glass, the user interface device comprising:
   an infrared (IR) mountable switch configured as an input peripheral to an interactive display system and adapted to be mounted on a first surface of the low emissivity glass, wherein all components of the user interface device are secured behind the low emissivity glass and opposite a second surface and a reflective zone, the IR mountable switch comprising:
      at least one IR emitter emitting IR radiation through the low emissivity glass;
      at least one IR sensor configured to detect a reflection of the IR radiation through the low emissivity glass;
   wherein the IR mountable switch generates, from emitted IR radiation transmitted directly through the low emissivity glass, at least one trigger area with a reflective zone on the second surface of the low emissivity glass opposite the first surface and at a location substantially opposite the at least one IR emitter of the IR mountable switch;
   wherein the at least one IR sensor is calibrated to detect reflection of IR radiation reflected back through the low emissivity glass by an IR-reflective object when the at least one IR emitter emits the IR radiation through the low emissivity glass;
   wherein the at least one IR sensor detects a no touch value of IR radiation when no object is in front of the reflective zone, the no touch value comprising a measured value of IR radiation caused by ambient light; and
   wherein the at least one IR sensor detects a touch value of IR radiation when the IR radiation impacts the IR-reflective object located at the reflective zone and reflects back through the low emissivity glass in the reflective zone to the at least one IR sensor, the touch value of IR radiation being greater than the no touch value of IR radiation;
   wherein the at least one IR sensor both emits and detects IR radiation in a combined configuration working in conjunction with the at least one IR emitter;
   wherein the at least one IR emitter, the at least one IR sensor and printed circuit board (PCB) components are placed within a multi-layered system further comprising at least one decoupling capacitor placed between the at least one IR sensor and at least one IR emitter as a physical radiation barrier between the at least one IR, sensor and at least one IR emitter.

9. The user interface device as claimed in claim 8, wherein the low emissivity glass has a U value of 0.47 Btu/h·ft$^{2}$·° F. or lower, such that the IR mountable switch is activated through the retail storefront heat insulating glass of various glass layers including low emissivity glass which aims to block IR radiation due to emissivity requirements of many windows in certain retail storefront applications.

10. The user interface device as claimed in claim 8, wherein the low emissivity glass has an SHGC of 0.70 or lower.

11. The user interface device as claimed in claim 8, wherein the low emissivity glass includes a metal based coating.

12. The user interface device as claimed in claim 8, wherein the low emissivity glass has multiple panes.

13. The user interface device as claimed in claim 8, wherein the IR radiation intensity of the IR emitter is at least 10 mW/sr.

14. A user interface system for use with a retail storefront low emissivity glass, the user interface system comprising:
   an interactive display system;
   an infrared (IR) mountable switch configured as an input peripheral to the interactive display system and adapted to be mounted on a first surface of the low emissivity glass, wherein all components of the interactive display system are secured behind the low emissivity glass inside the retail storefront and opposite a second surface and a reflective zone, the IR mountable switch comprising:
      at least one IR emitter emitting IR radiation through the low emissivity glass; and
      at least one IR sensor configured to detect a reflection of the IR radiation through the low emissivity glass;
   wherein IR mountable switch generates, from emitted IR radiation transmitted directly through the low emissivity glass, at least one trigger area with a reflective zone on the second surface of the low emissivity glass opposite the first surface and at a location substantially opposite the at least one IR emitter of the IR mountable switch;
   wherein the at least one IR sensor is calibrated to detect reflection of IR radiation reflected back through the low emissivity glass by an IR-reflective object when the at least one IR emitter emits the IR radiation through the low emissivity glass;
   wherein the at least one IR sensor detects a no touch value of IR radiation when no object is in front of the reflective zone, the no touch value comprising a measured value of IR radiation caused by ambient light; and
   wherein the at least one IR sensor detects a touch value of IR radiation when the IR radiation impacts the IR-reflective object located at the reflective zone and reflects back through the low emissivity glass in the reflection zone to the at least one IR sensor, the touch value of IR radiation being greater than the no touch value of IR radiation;
   wherein the at least one IR sensor both emits and detects IR radiation in a combined configuration working in conjunction with the at least one IR emitter;
   wherein the at least one IR emitter, the at least one IR sensor and printed circuit board (PCB) components are placed within a multi-layered system further comprising at lest one decoupling capacitor placed between the at least one IR sensor and the at least one IR emitter as a physical radiation barrier between the at least one IR sensor and at least one IR emitter.

15. The user interface system as claimed in claim 14, wherein said system is adapted to be programmed remotely via a network.

16. The user interface system as claimed in claim 14, wherein said system monitors all inputs from each of the trigger areas generated by the IR mountable switch for user interaction with one or more of the trigger areas.

17. The user interface system as claimed in claim 14, wherein said system re-calibrates itself during use based on user input activations.

18. The method as claimed in claim 1, wherein the method further includes the step of monitoring all inputs from each of a plurality of button switches responsive to any one button switch being activated.

19. The user interface system as claimed in claim 14, wherein the low emissivity glass has a U value of 0.47 Btu/h·ft$^2$·° F. or lower, such that the IR mountable switch is activated through the retail storefront heat insulating glass of various glass layers including low emissivity glass which aims to block IR radiation due to emissivity requirements of many windows in certain retail storefront applications.

20. The user interface system as claimed in claim 14, wherein the low emissivity glass has an SHGC of 0.70 or lower.

21. The device of claim 8, wherein the reflection of the IR radiation is caused by the IR-reflective object being placed near the second surface of the low emissivity glass at the reflective zone, and wherein the interaction comprises placing a hand, finger, or other IR reflective object over or in front of the at least one trigger area.

22. The device of claim 8, wherein an entirety of the user interface device is adapted to be mounted behind the low emissivity glass comprising tinted glass on the first surface of the low emissivity glass that is inside a retail storefront and opposite the second surface and the reflective zone, thereby creating a non-mounted side of the retail storefront.

23. The method of claim 1, further comprising calibrating the at least one IR sensor, the calibrating comprising:
   reading a steady state input of the interface device, wherein the steady state input is provided when no IR-reflective object is placed in front of the reflective zone;
   reading an activation input, wherein the activation input is provided when the IR-reflective object is placed in front of the reflective zone;
   determining a threshold delta between the activation input and the steady state input, wherein the threshold delta sets a trigger point for the signal input to the interface device; and
   recording the threshold delta as the sensitivity level of the at least one IR sensor.

* * * * *

UNITED STATES PATENT AND TRADEMARK OFFICE
CERTIFICATE OF CORRECTION

PATENT NO. : 10,461,743 B2  
APPLICATION NO. : 14/799112  
DATED : October 29, 2019  
INVENTOR(S) : Ilya Alshine Page 1 of 1

It is certified that error appears in the above-identified patent and that said Letters Patent is hereby corrected as shown below:

On the Title Page

"(63) Continuation of application No. PCT/US2014/011746, filed on Jan. 14, 2014", should be deleted; --(63) Continuation of application No. PCT/US2014/011476, filed on Jan. 14, 2014-- should be inserted.

"(60) Provisional application No. 61/751,424, filed on Jan. 11, 2013", should be deleted; --(60) Provisional application No. 61/752,424 filed on Jan. 14, 2013-- should be inserted.

In the Claims

Claim 1, Column 10, Line 21 insert --the-- before "retail storefront";

Claim 1, Column 10, Line 54 insert --IR-- before "emitter";

Claim 1, Column 10, Line 57 insert --at-- before "least";

Claim 8, Column 11, Line 65 insert --the-- before "at least";

Claim 8, Column 11, Line 66 delete "IR," and insert --IR--;

Claim 14, Column 12, Line 64 delete "lest" and insert --least--.

Signed and Sealed this  
Twenty-first Day of April, 2020

Andrei Iancu  
*Director of the United States Patent and Trademark Office*